(12) United States Patent
Pan et al.

(10) Patent No.: US 12,727,428 B2
(45) Date of Patent: Sep. 1, 2026

(54) WAFER CONTAINER, TOP COVER THEREOF, AND METHOD FOR MANAGING WAFER CONTAINERS

(71) Applicant: NANYA TECHNOLOGY CORPORATION, New Taipei city (TW)

(72) Inventors: Chi Ming Pan, New Taipei City (TW); Pohsien Chen, New Taipei City (TW); Zheng-Xun Yang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 0 days.

(21) Appl. No.: 18/623,522

(22) Filed: Apr. 1, 2024

(65) Prior Publication Data

US 2025/0308963 A1 Oct. 2, 2025

(51) Int. Cl.

*H01L 21/673* (2006.01)
*H10P 72/00* (2026.01)
*H10P 72/10* (2026.01)
*H10P 72/30* (2026.01)

(52) U.S. Cl.

CPC ...... *H10P 72/1916* (2026.01); *H10P 72/0606* (2026.01); *H10P 72/1912* (2026.01); *H10P 72/1918* (2026.01); *H10P 72/3214* (2026.01); *H10P 72/3218* (2026.01); *H10P 72/3221* (2026.01)

(58) Field of Classification Search

CPC ........... H01L 21/6734; H01L 21/67376; H01L 21/67369; B65D 41/00; B65D 41/02; B65D 41/10; B65D 41/16
USPC .......................................... 206/710–712, 454
See application file for complete search history.

(56) References Cited

U.S. PATENT DOCUMENTS 5,482,161 A * 1/1996 Williams .......... H01L 21/67369 414/217
5,947,318 A * 9/1999 Palm ................... B65D 51/222 222/541.2
8,770,410 B2 * 7/2014 Ogawa ............. H01L 21/67379 206/454
2009/0277816 A1 11/2009 Aramaki
2012/0038151 A1 * 2/2012 Bernard ................. B65D 90/00 29/428
2017/0186637 A1 * 6/2017 Cho .................. H01L 21/67376

* cited by examiner

*Primary Examiner* — Robert Poon
(74) *Attorney, Agent, or Firm* — CKC & Partners Co., LLC

(57) ABSTRACT

A method for managing a plurality of wafer containers in a facility includes: using an overhead hoist transport system to transport the wafer containers, the overhead hoist transport system includes a vehicle, the vehicle includes a grip device, each of the wafer containers includes a top flange, and the grip device is configured to grip the top flange; categorizing each of the wafer containers into a safe-to-use group or an unsafe-to-use group; and covering the top flange of each wafer container in the unsafe-to-use group with a top cover, wherein the top cover is sized or shaped to prevent the top flange from being gripped by the grip device.

7 Claims, 7 Drawing Sheets

51(50)
57
59
53
58
56
28
29
92
26
25
23
21

WAFER CONTAINER, TOP COVER THEREOF, AND METHOD FOR MANAGING WAFER CONTAINERS

BACKGROUND

Technical Field

The present disclosure relates to a wafer container, a top cover for a wafer container, and a method for managing a plurality of wafer containers in a facility.

Description of Related Art

A semiconductor fabrication facility may include wafer containers that need maintenance (e.g., require cleaning). If not properly managed, the wafer containers that need maintenance could be mixed with normal wafer containers and causing contamination or damage of wafers or wafer processing equipment.

SUMMARY

An aspect of the disclosure is to provide a top cover for interrupting transport of a wafer container that is unsafe to use (e.g., a wafer container that is under maintenance).

In accordance with an embodiment of the present disclosure, a wafer container includes a container main body, a top flange and a top cover. The container main body is configured to accommodate one or more semiconductor wafers. The top flange projects from an upper surface of the container main body and includes a neck portion and a head portion. The neck portion is connected between the container main body and the head portion. The head portion is wider than the neck portion. The top cover is configured to interrupt transport of the wafer container. The top cover is provided atop the top flange. The head portion of the top flange has a first height and a first width. The top cover has a second height and a second width. The second height is greater than the first height, and the second width is greater than the first width.

In one or more embodiments of the present disclosure, the top cover includes a sidewall surrounding the head portion of the top flange. The sidewall has a lower surface, and the lower surface is at a position below the head portion of the top flange.

In one or more embodiments of the present disclosure, the top cover includes an upper wall and a sidewall. The upper wall faces an upper surface of the head portion of the top flange. The sidewall is connected to the upper wall and is arranged around the head portion. The head portion has a cavity. The upper wall includes a protrusion inserted in the cavity.

In one or more embodiments of the present disclosure, a periphery of the head portion is formed with at least one notch. The sidewall includes at least one protrusion mating with the at least one notch.

In one or more embodiments of the present disclosure, the top cover includes a shell and a cushioning member. The shell covers an upper surface and a lateral surface of the head portion of the top flange. The cushioning member is disposed on an upper surface of the shell.

In one or more embodiments of the present disclosure, the top cover comprises an extension structure connected to the shell and extending laterally beyond a periphery of the container main body.

In accordance with an embodiment of the present disclosure, a method for managing a plurality of wafer containers in a facility includes: using an overhead hoist transport system to transport the wafer containers, the overhead hoist transport system includes a vehicle, the vehicle includes a grip device, each of the wafer containers includes a top flange, and the grip device is configured to grip the top flange; categorizing each of the wafer containers into a safe-to-use group or an unsafe-to-use group; and covering the top flange of each wafer container in the unsafe-to-use group with a top cover, wherein the top cover is sized or shaped to prevent the top flange from being gripped by the grip device.

In one or more embodiments of the present disclosure, the method further includes: lowering the grip device; and as the grip device is lowered, detecting whether the grip device is balanced by a balance detection mechanism of the vehicle. The top cover is wider than the top flange to create an imbalance condition of the grip device when the grip device contacts the top cover.

In one or more embodiments of the present disclosure, the method further includes: detecting a head portion of the top flange by a flange detection mechanism provided on the grip device. The top flange further includes a neck portion, and the head portion is wider than the neck portion. The top cover is taller than the head portion of the top flange to prevent the head portion of the top flange from being detected by the flange detection mechanism.

In one or more embodiments of the present disclosure, the top cover includes a sidewall surrounding the head portion of the top flange. The sidewall has a lower surface, and the lower surface is at a position below the head portion of the top flange.

In one or more embodiments of the present disclosure, the method further includes: scanning for obstacle between the vehicle and a first wafer container of the wafer containers, in which the scanning is performed by an obstacle scanner of the vehicle. The top cover includes an extension structure extending laterally beyond a periphery of a container main body of the first wafer container, and the extension structure causes the obstacle scanner to detect presence of an obstacle.

In accordance with an embodiment of the present disclosure, a top cover for interrupting transport a wafer container includes a shell. The shell is provided atop a top flange of the wafer container. The shell includes an upper wall and a sidewall. The sidewall is arranged along a periphery of the upper wall and forms a recess with the upper wall. The recess is configured to receive the top flange of the wafer container. The top flange includes a neck portion and a head portion. The head portion is connected to the neck portion and is wider than the neck portion. The top cover is wider and taller than the head portion of the top flange.

In sum, the present disclosure provides a technique to prevent accidental usage of wafer containers that are unsafe to use (e.g., wafer containers that could contaminate or damage semiconductor wafers or wafer processing equipment). Any wafer container categorized as unsafe-to-use is covered with a top cover sized or shaped (e.g., having an increased width or height, including an extension structure, etc.) to prevent a top flange of the wafer container from being gripped by a grip device of a vehicle for moving wafer containers. By this arrangement, transport of any wafer container categorized as unsafe-to-use is automatically interrupted and thus the unsafe-to-use wafer container is prevented from getting involved in the fabrication of wafers.

It is to be understood that both the foregoing general description and the following detailed description are by examples, and are intended to provide further explanation of the disclosure as claimed.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
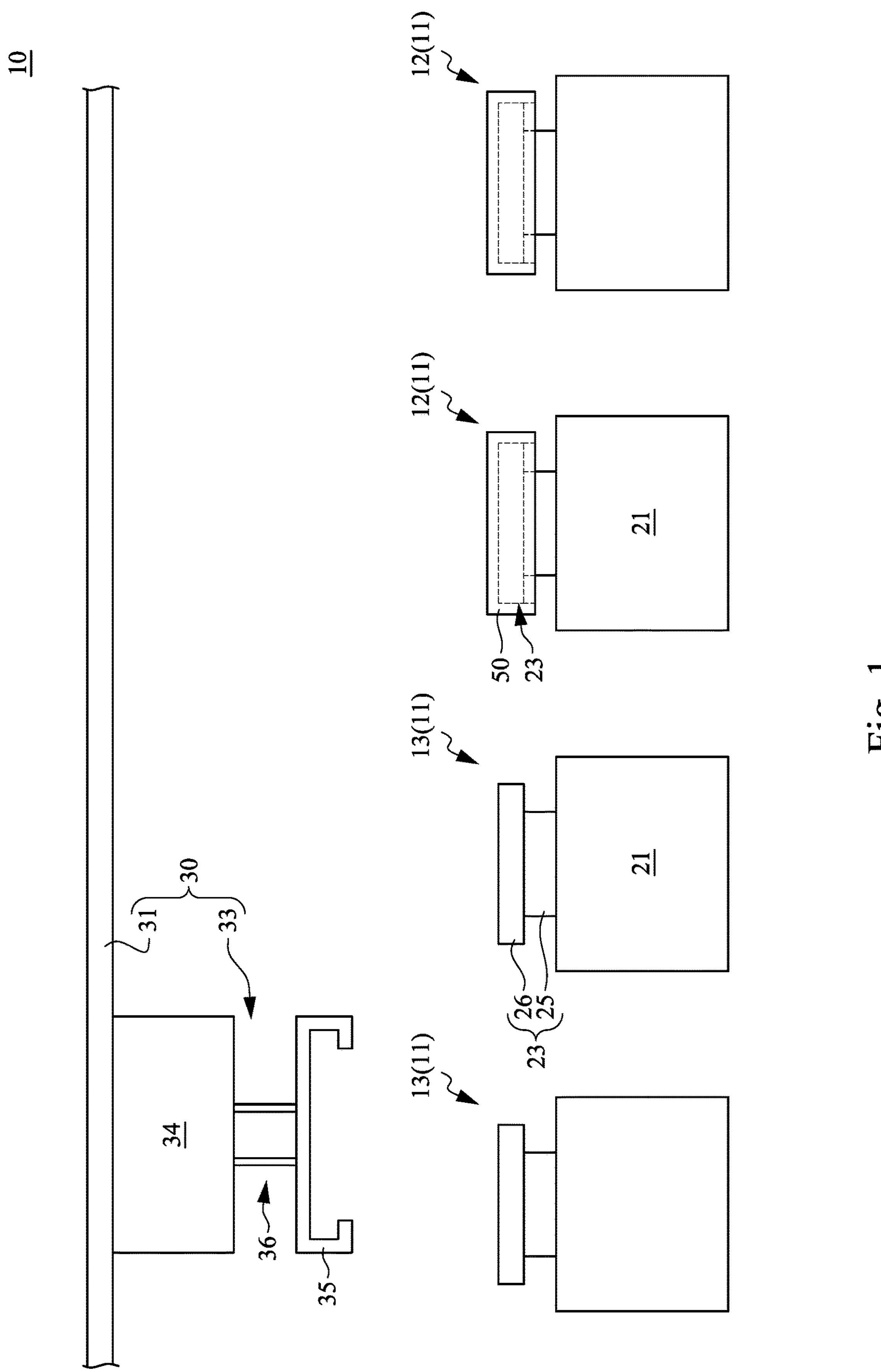
FIG. 1 illustrates a schematic side view of a facility in accordance with an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 illustrates a schematic side view of a facility 10 in accordance with an embodiment of the present disclosure. The facility 10 is, for example, a semiconductor fabrication facility. The facility 10 includes a plurality of wafer containers 11. Each of the wafer containers 11 is configured to accommodate one or more semiconductor wafers. The wafer containers 11 are, for example, front opening unified pods (FOUPs). The facility 10 further includes an overhead hoist transport system 30 configured to transport the wafer containers 11 within the facility 10. For example, the overhead hoist transport system 30 can transport the wafer containers 11 between various wafer storage stations and wafer processing equipment (not depicted) in the facility 10.

As shown in FIG. 1, each of the wafer containers 11 in the facility 10 is categorized into a safe-to-use group or an unsafe-to-use group. One or more wafer containers 12 in the unsafe-to-use group are wafer containers that could contaminate or damage the semiconductor wafers or the wafer processing equipment. For example, the wafer containers 12 in the unsafe-to-use group may include wafer containers that need maintenance (e.g., require cleaning). One or more wafer containers 13 in the safe-to-use group are wafer containers that satisfy the requirements for protection against the semiconductor wafers or the wafer processing equipment (e.g., wafer containers that function normally and do not include contaminants). In some embodiments, the wafer containers 11 in the facility 10 may be categorized by wafer inspection equipment (not depicted) of the facility 10.

As shown in FIG. 1, each of the wafer containers 13 in the safe-to-use group includes a container main body 21 and a top flange 23 connected to the container main body 21. The container main body 21 is configured to accommodate one or more semiconductor wafers. The top flange 23 projects from an upper surface of the container main body 21 and includes a neck portion 25 and a head portion 26. The neck portion 25 is connected between the container main body 21 and the head portion 26. The head portion 26 is wider than the neck portion 25.

As shown in FIG. 1, the overhead hoist transport system 30 includes a transport rail 31 and a vehicle 33. The transport rail 31 extends between various locations (e.g., wafer storage stations or wafer processing equipment) in the facility 10. The vehicle 33 is disposed on the transport rail 31 is configured to move along the transport rail 31. The vehicle 33 includes a vehicle main body 34, a grip device 35 and a vertical motion driving device 36. The vehicle main body 34 is configured to store at least one wafer container 11. The grip device 35 is configured to pick up the wafer container 11 from a specific location (e.g., a load port) and move the wafer container 11 to the vehicle main body 34. The grip device 35 is also configured to remove the wafer container 11 from the vehicle main body 34 and drop the wafer container 11 at a specific location (e.g., a load port). The grip device 35 is configured to pick up the wafer container 11 by gripping the top flange 23 of the wafer container 11. The grip device 35 can move vertically, as driven by the vertical motion driving device 36 connected between the grip device 35 and the vehicle main body 34. The vertical motion driving device 36 may include one or more belts.

As shown in FIG. 1, each of the wafer containers 12 in the unsafe-to-user group includes a container main body 21 and a top flange 23 that are structurally identical to those of the wafer containers 13. Each of the wafer containers 12 further includes a top cover 50 provided atop the top flange 23. The top cover 50 covers the top flange 23, and the top cover 50 is sized or shaped to prevent the top flange 23 from being gripped by the grip device 35. In other words, the top cover 50 can interrupt transport the wafer containers 12 in the unsafe-to-use group. By this arrangement, the wafer containers 12 in the unsafe-to-use group would not accidentally be used to carry semiconductor wafers in the facility 10, and accordingly, contamination and damage of the semiconductor wafers or the wafer processing equipment can be prevented.

Figure 2:
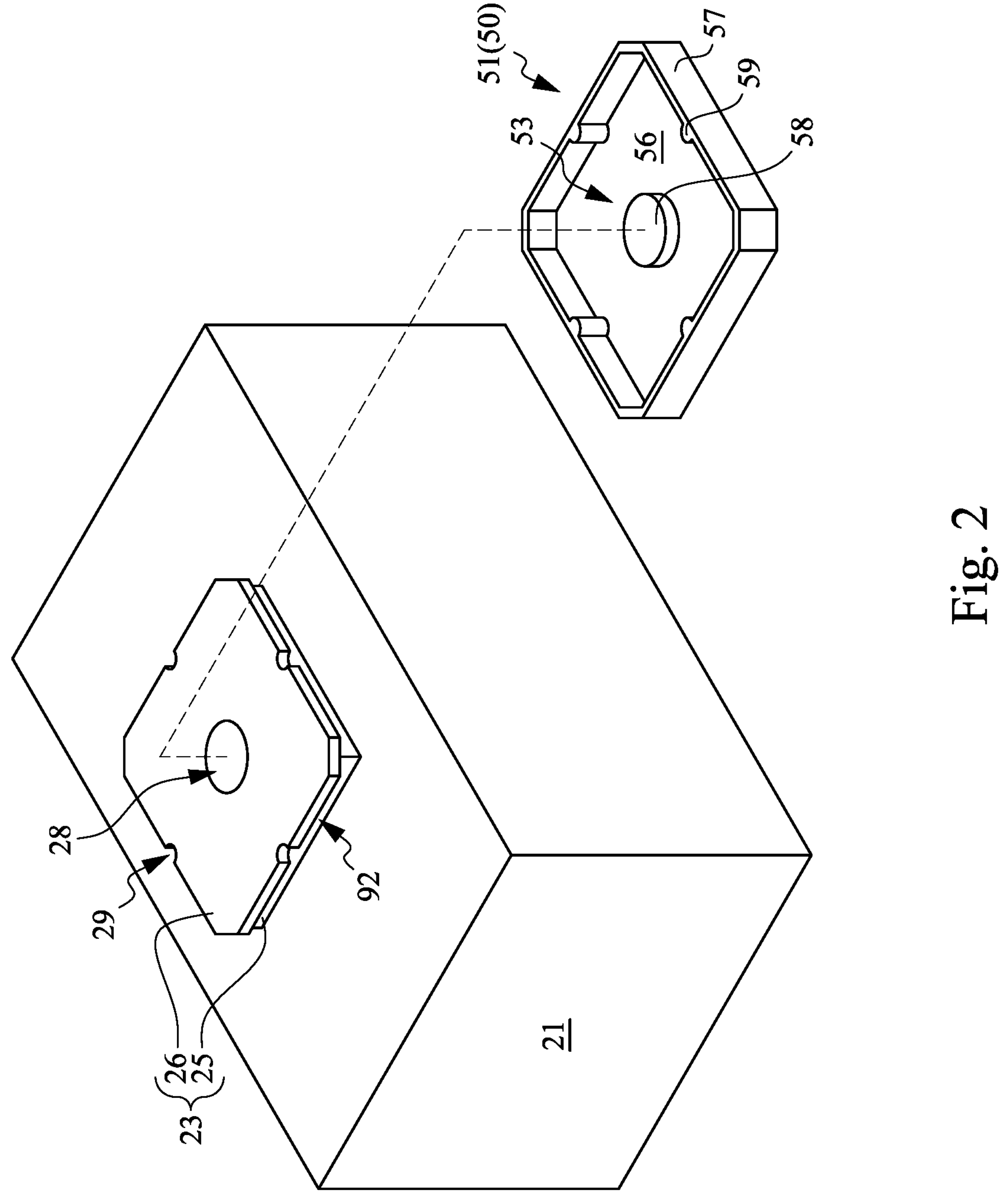
FIG. 2 illustrates an exploded view of one of the wafer containers shown in FIG. 1.

Reference is made to FIG. 2. FIG. 2 illustrates an exploded view of one of the wafer containers 12 shown in FIG. 1. In some embodiments, the top cover 50 includes a shell 51 provided atop the top flange 23. The shell 51 includes an upper wall 56 and a sidewall 57 connected to the upper wall 56. The sidewall 57 is arranged along a periphery of the upper wall 56 and forms a recess 53 with the upper wall 56. The recess 53 is configured to receive the top flange 23. When the top cover 50 is placed on the top flange 23, the upper wall 56 faces and covers an upper surface of the head portion 26 of the top flange 23, and the sidewall 57 is arranged around the head portion 26 and covers a lateral surface of the head portion 26.

As shown in FIG. 2, in some embodiments, the head portion 26 of the top flange 23 has a cavity 28. The upper wall 56 of the shell 51 includes a protrusion 58 projecting from an underside of the upper wall 56. The protrusion 58 is configured to be inserted in the cavity 28 of the head portion 26 when the top cover 50 is placed on the top flange 23. In some embodiments, a periphery of the head portion 26 is formed with at least one notch 29. The sidewall 57 of the shell 51 includes at least one protrusion 59 projecting from an inner surface of the sidewall 57. The protrusion 59 is configured to mate with the notch 29 of the head portion 26 when the top cover 50 is placed on the top flange 23.

Figure 3:
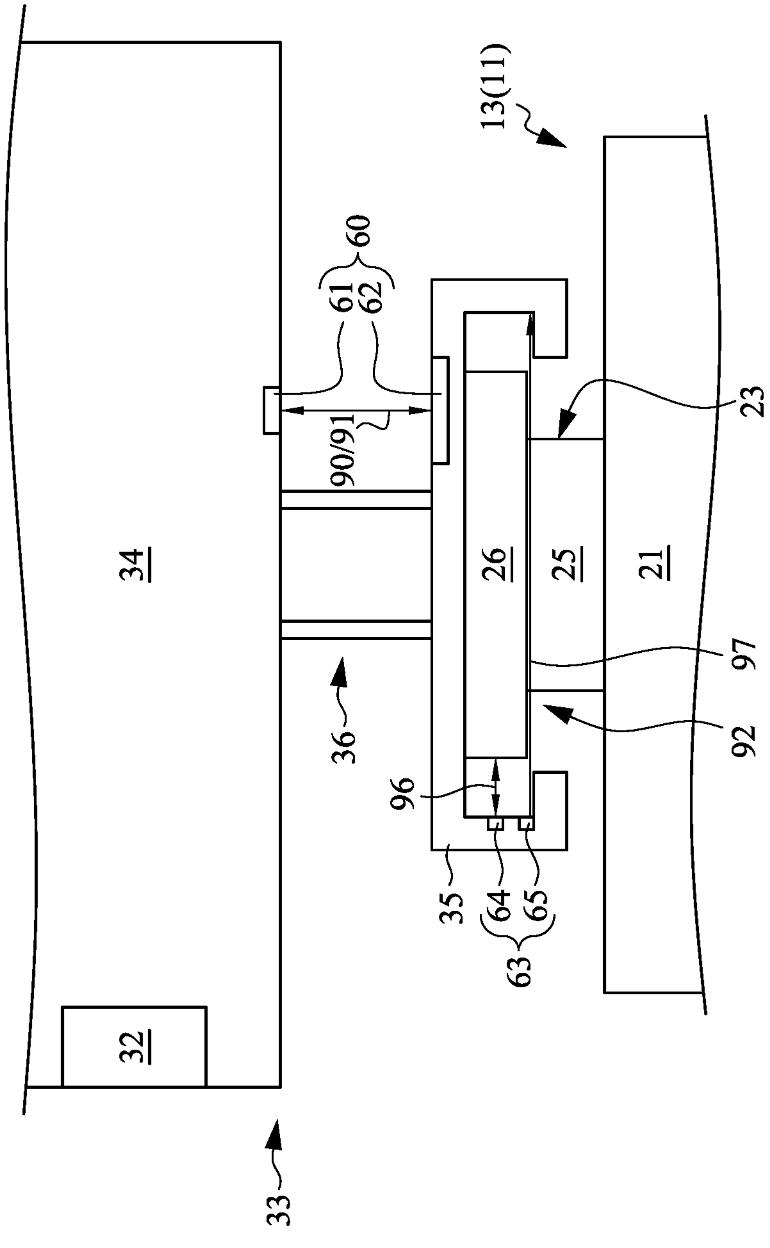
FIG. 3 illustrates a schematic view of the vehicle shown in FIG. 1 attempting to pick up a wafer container without top cover.

Reference is made to FIG. 3. FIG. 3 illustrates a schematic view of the vehicle 33 shown in FIG. 1 attempting to pick up the wafer container 13 (i.e., a wafer container without top cover). In some embodiments, the vehicle 33 further includes a balance detection mechanism 60. The balance detection mechanism 60 is configured to detect whether the grip device 35 is balanced as the grip device 35 is lowered from the vehicle main body 34 by the vertical motion driving device 36. In some embodiments, the balance detection mechanism 60 includes a signal transceiver 61 and a reflective plate 62. The signal transceiver 61 is disposed on the vehicle main body 34, and the reflective plate 62 is disposed on the grip device 35. The signal transceiver 61 is configured to downwardly emit a test signal 90 (e.g., a light signal, such as an infrared signal). If the grip device 35 is balanced (e.g., when the grip device 35 is horizontal), the reflective plate 62 can reflect the test signal 90 and the reflected signal 91 would return to and be received by the signal transceiver 61. On the other hand, if the grip device 35 is not balanced (e.g., when the grip device 35 is tilted), the reflective plate 62 may not reflect the test signal 90, or the reflective plate 62 may reflect the test signal 90 but the reflected signal 91 travels obliquely, such that the signal transceiver 61 cannot receive the reflected signal 91.

As shown in FIG. 3, in some embodiments, the balance detection mechanism 60 is configured to provide a sensing signal indicative of whether the grip device 35 is balanced. The balance detection mechanism 60 can provide the sensing signal periodically (e.g., every 0.1 second, every 0.05 second, etc.). The sensing signal may be provided by the signal transceiver 61 of the balance detection mechanism 60. In some embodiments, the vehicle 33 further includes a control system 32. The control system 32 is communicably coupled to the balance detection mechanism 60 and is configured to receive the sensing signal. The control system 32 is further configured to instruct the vehicle 33 to pause or stop transporting wafer container if the sensing signal indicates that the grip device 35 is not balanced. In some embodiments, the control system 32 may include electronic components such as a processor, a data storage device and a communication device.

As shown in FIG. 3, when the vehicle 33 attempts to pick up the wafer container 13 without the top cover, the grip device 35 can maintain its balance during the process of lowering the grip device 35 (e.g., the balance detection mechanism 60 constantly outputs sensing signal indicating the grip device 35 is balanced), and the grip device 35 can successfully fit over the top flange 23 of the wafer container 13.

As shown in FIG. 3, in some embodiments, the vehicle 33 further includes a flange detection mechanism 63. The flange detection mechanism 63 is provided on the grip device 35 and is configured to detect the head portion 26 of the top flange 23, which is a structure that the grip device 35 can grip on to move the wafer container 13.

As shown in FIG. 3, in some embodiments, the flange detection mechanism 63 includes a first signal transceiver 64 and a second signal transceiver 65. The first signal transceiver 64 is positioned to face the lateral surface of the head portion 26 of the top flange 23. The second signal transceiver 65 is positioned to face a gap 92 between the head portion 26 of the top flange 23 and the container main body 21 (the gap 92 is also shown in FIG. 2). The first signal transceiver 64 and the second signal transceiver 65 are configured to horizontally emit a first test signal 96 and a second test signal 97, respectively. If the grip device 35 is in position as shown in FIG. 3 (e.g., when the head portion 26 enters a central opening of the grip device 35), the first test signal 96 is reflected by the lateral surface of the head portion 26 and returns to the first signal transceiver 64, and the second test signal 97 is emitted into the gap 92 and is not reflected.

As shown in FIG. 3, in some embodiments, the first signal transceiver 64 and the second signal transceiver 65 are configured to provide a first sensing signal and a second sensing signal, respectively. The first sensing signal is indicative of whether the first signal transceiver 64 receives any reflected signal. The second sensing signal if indicative of whether the second signal transceiver 65 receives any reflected signal. In some embodiments, the control system 32 is communicably coupled to the flange detection mechanism 63 and is configured to receive the first sensing signal and the second sensing signal. The control system 32 is further configured to instruct the vehicle 33 to pause or stop transporting wafer container if the second sensing signal indicates that the second signal transceiver 65 receives a reflected signal.

As shown in FIG. 3, when the vehicle 33 attempts to pick up the wafer container 13 without the top cover, the grip device 35 can successfully detect the head portion 26 of the top flange 23 of the wafer container 13 (e.g., the first sensing signal indicates that a reflected signal is received by the first signal transceiver 64, and the second sensing signal indicates that the second signal transceiver 65 does not receive any reflected signal). Consequently, the vehicle 33 can proceed to pick up the wafer container 13. For example, the tips of the grip device 35 can extend horizontally towards the neck portion 25, such that the grip device 35 can hold the top flange 23 of the wafer container 13.

Figure 4:
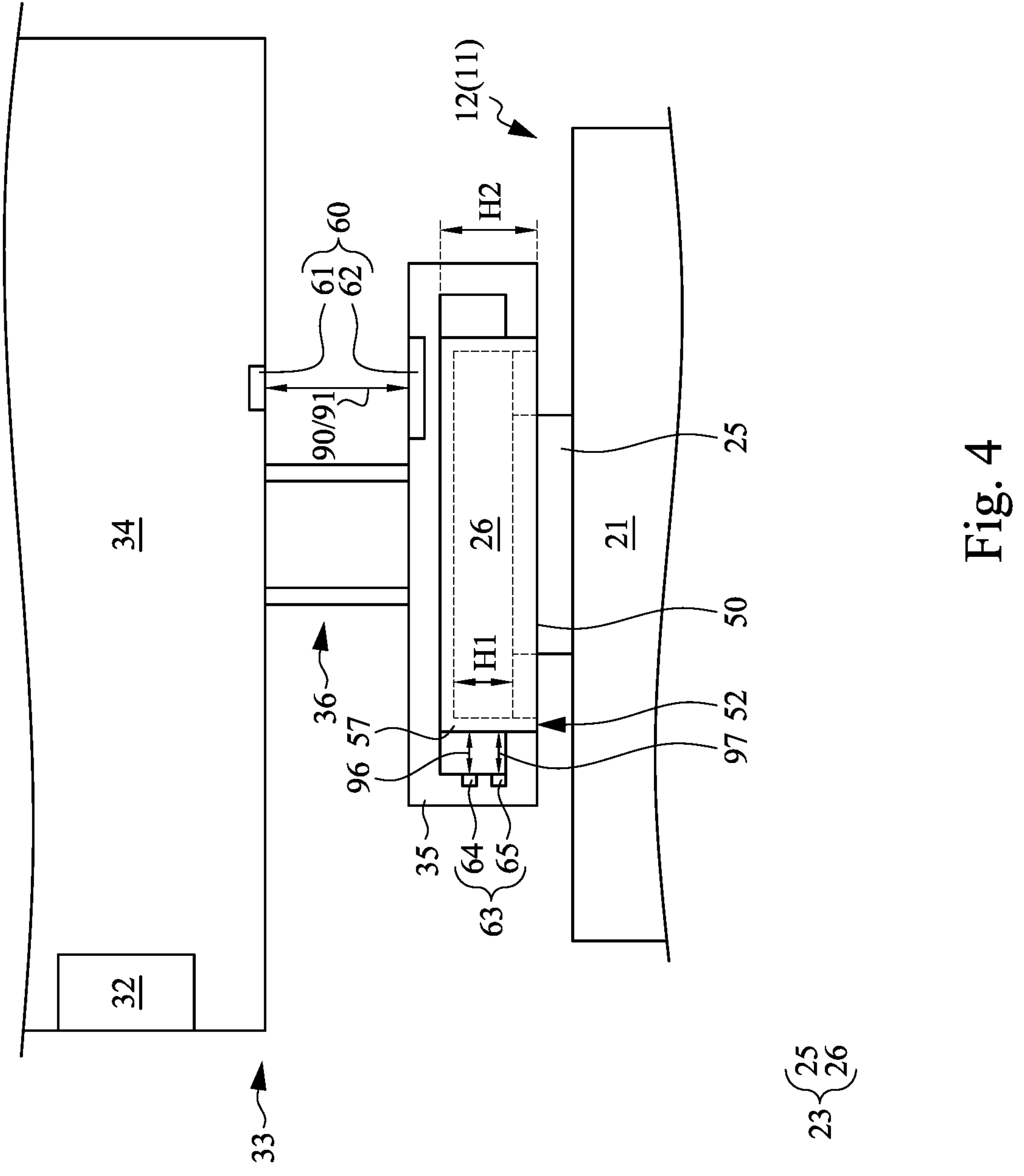
FIGS. 4 and 5 illustrate schematic views of the vehicle shown in FIG. 1 attempting to pick up a wafer container having the top cover.

Reference is made to FIG. 4. FIG. 4 illustrates a schematic view of the vehicle 33 shown in FIG. 1 attempting to pick up the wafer container 12 (i.e., a wafer container having the top cover 50). In some embodiments, the top cover 50 is taller than the head portion 26 of the top flange 23 to prevent the head portion 26 of the top flange 23 from being detected by the flange detection mechanism 63. In some embodiments, the head portion 26 of the top flange 23 has a first height H1, the top cover 50 has a second height H2, and the second height H2 is greater than the first height H1.

As shown in FIG. 4, when the vehicle 33 attempts to pick up the wafer container 12, the grip device 35 cannot detect the head portion 26 of the top flange 23 of the wafer container 12, because the second sensing signal indicates that the second signal transceiver 65 receives a reflected signal, which is the second test signal 97 emitted by the second signal transceiver 65 and reflected by the sidewall 57 of the top cover 50. As a result, the grip device 35 ceases picking up the wafer container 12.

As shown in FIG. 4, in some embodiments, the sidewall 57 of the top cover 50 has a lower surface 52, and the lower surface 52 is at a position below the head portion 26 of the top flange 23. By this arrangement, the sidewall 57 is ensured to reflect the second test signal 97 output by the second signal transceiver 65 to make the vehicle 33 unable to detect the head portion 26 of the top flange 23.

Figure 5:
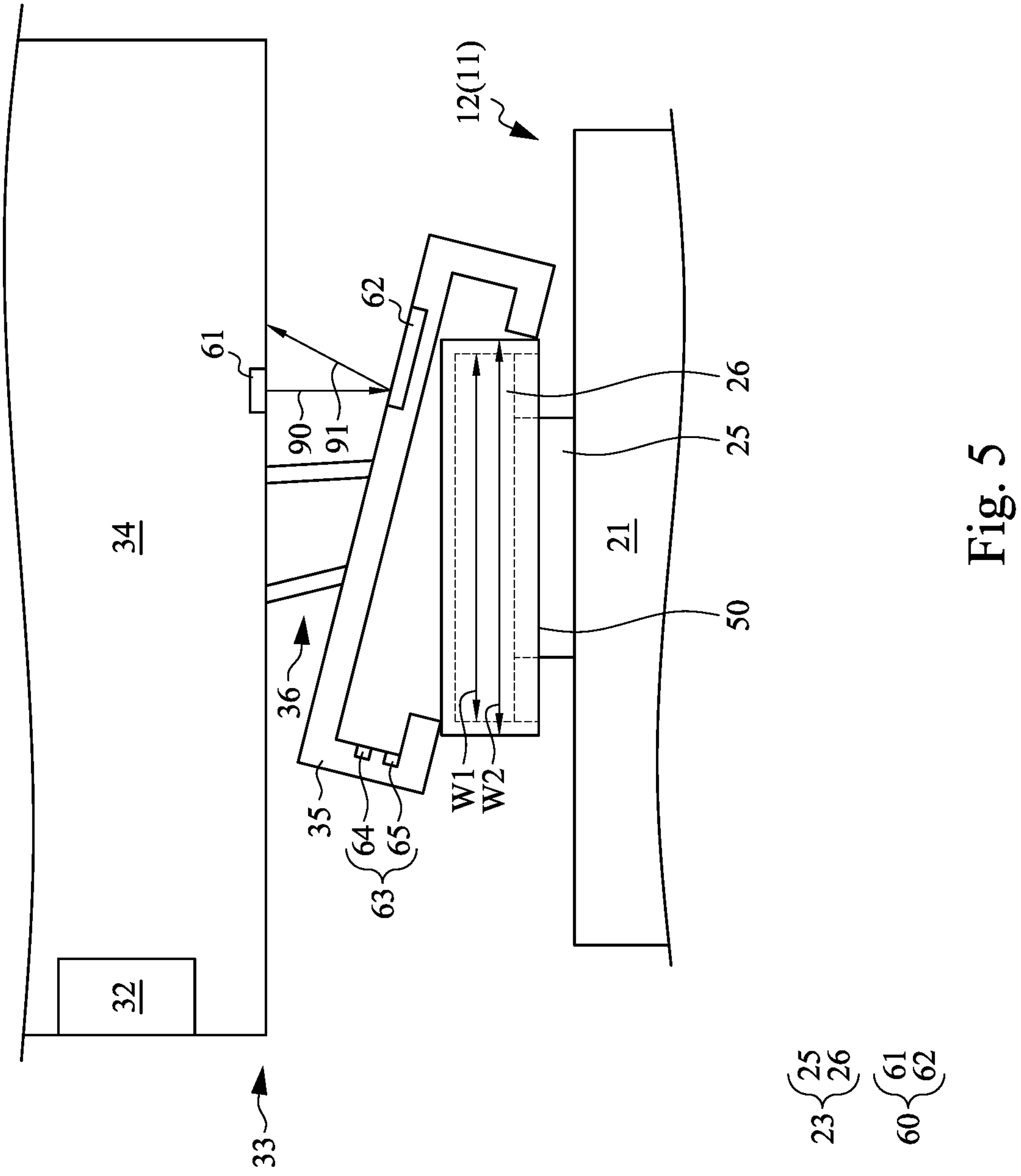

Reference is made to FIG. 5. FIG. 5 illustrates another schematic view of the vehicle 33 shown in FIG. 1 attempting to pick up the wafer container 12 (i.e., a wafer container having the top cover 50). In some embodiments, the top cover 50 is wider than the top flange 23 to create an imbalance condition of the grip device 35 when the grip device 35 contacts the top cover 50. In some embodiments, the head portion 26 of the top flange 23 has a first width W1, the top cover 50 has a second width W2, and the second width W2 is greater than the first width W1.

As shown in FIG. 5, when the vehicle 33 attempts to pick up the wafer container 12, if the grip device 35 is not properly aligned with the wafer container 12, the grip device 35 becomes tilted as it makes contact the top cover 50. The sensing signal provided by the balance detection mechanism 60 thus indicates the grip device 35 is not balanced, since the reflected signal 91 is not received by the signal transceiver 61. As a result, the grip device 35 ceases picking up the wafer container 12.

In some embodiments, the top cover 50 includes a metallic material, such as aluminum. By this arrangement, the top cover 50 can be made heavier and thus can stably stay on the top flange 23 of the wafer container 12. The top cover 50 can be prevented from falling off the top flange 23 when being impacted by the grip device 35. In other embodiments, the top cover 50 may include other materials, such as acrylic.

In some embodiments, the top cover 50 and the container main body 21 can have different color, such that the staff in the facility 10 can easily identify the wafer containers 12 in the unsafe-to-use group. In some embodiments, an outer surface of the top cover 50 includes a warning message, such that the staff in the facility 10 can easily identify the wafer containers 12 in the unsafe-to-use group.

Figure 6:
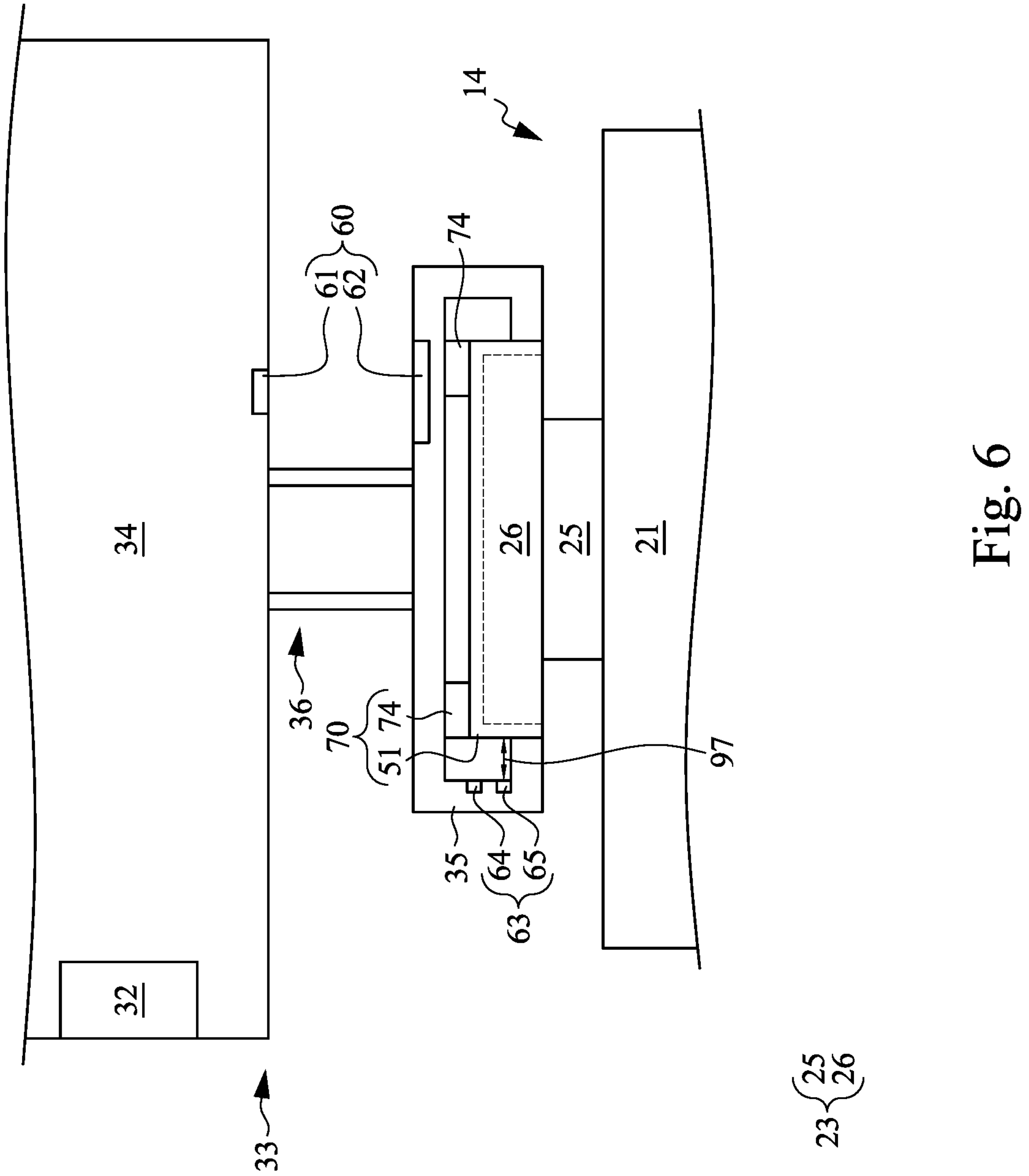
FIG. 6 illustrates a schematic view of the vehicle shown in FIG. 1 attempting to pick up a wafer container in accordance with another embodiment of the present disclosure.

Reference is made to FIG. 6. FIG. 6 illustrates a schematic view of the vehicle 33 shown in FIG. 1 attempting to pick up a wafer container 14 in accordance with another embodiment of the present disclosure. The wafer container 14 includes a top cover 70. Compared to the top cover 50 mentioned above, the top cover 70 of the present embodiment further includes a cushioning member 74 is disposed on an upper surface of the shell 51. The cushioning member 74 can provide the top cover 70 with increased height, so as to ensure that the second test signal 97 emitted by the second signal transceiver 65 is reflected. In some embodiments, the cushioning member 74 may include one or more mechanical springs or one or more elastic pads.

Figure 7:
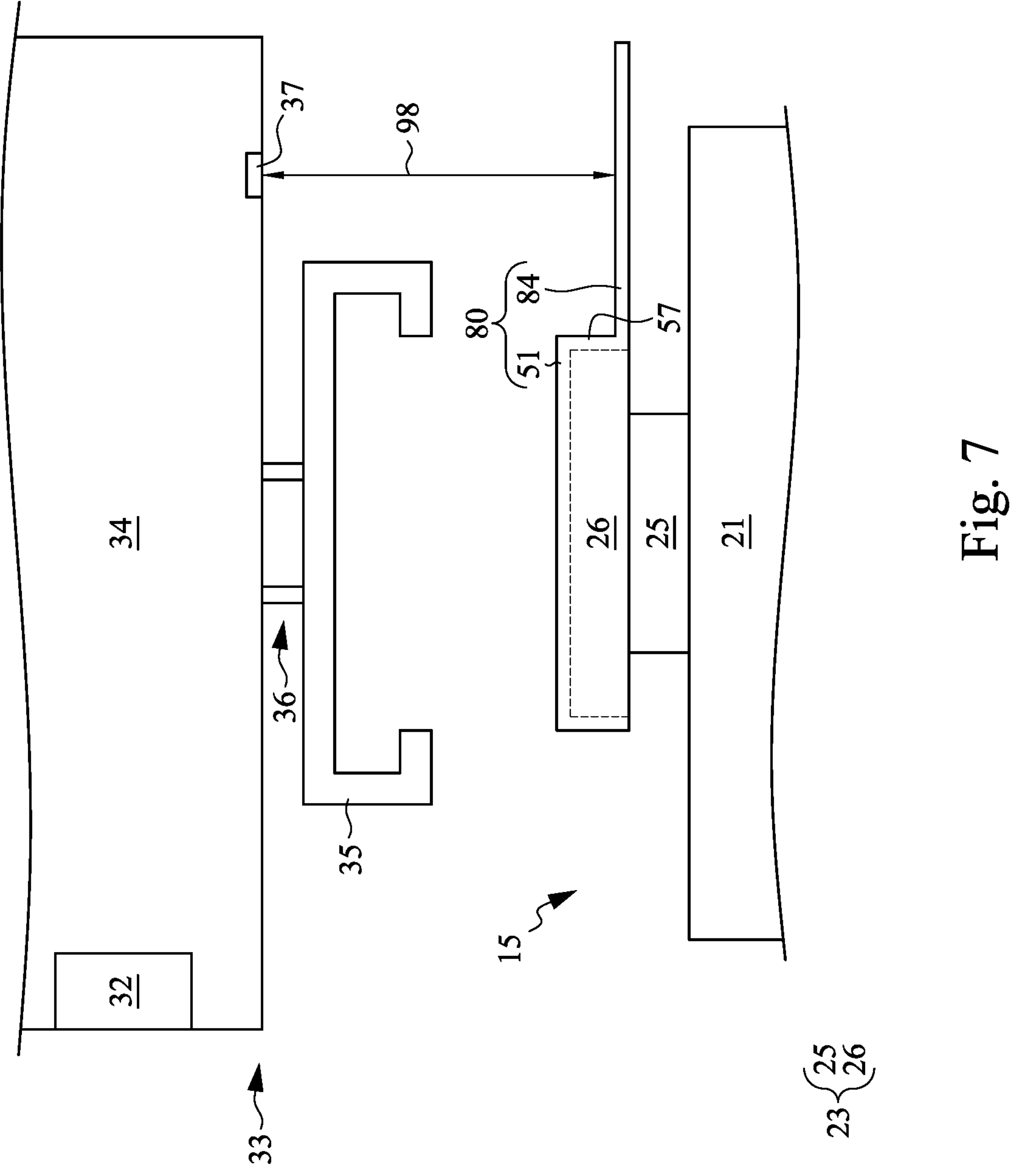
FIG. 7 illustrates a schematic view of the vehicle shown in FIG. 1 attempting to pick up a wafer container in accordance with another embodiment of the present disclosure.

FIG. 7 illustrates a schematic view of the vehicle 33 shown in FIG. 1 attempting to pick up a wafer container 15 in accordance with another embodiment of the present disclosure. In some embodiments, the vehicle 33 further includes an obstacle scanner 37. The obstacle scanner 37 is provided on the vehicle main body 34 and is configured to scan for an obstacle between the vehicle 33 and the wafer container that the vehicle 33 attempts to pick up. In some embodiments, the obstacle scanner 37 is configured to downwardly emit at least one test signal 98 (e.g., light signal, such as infrared signal). If there is no obstacle between the vehicle 33 and the wafer container, the obstacle scanner 37 would not receive any reflected signal. On the other hand, if there is any obstacle between the vehicle 33 and the wafer container, the test signal 98 would be reflected and received by the obstacle scanner 37. In some embodiments, the obstacle scanner 37 includes a signal transceiver. In some embodiments, the obstacle scanner 37 may emit the test signal 98 towards multiple different directions. For example, the test signal 98 emitted by the obstacle scanner 37 may cover a region taking the shape of a circular sector, a triangle, a cone, or other suitable shapes. In such embodiments, any obstacle present in the region causes the test signal 98 to be reflected and received by the obstacle scanner 37.

As shown in FIG. 7, in some embodiments, the obstacle scanner 37 is configured to provide a sensing signal indicative of presence or absence an obstacle between the vehicle 33 and the wafer container that the vehicle 33 attempts to pick up. In some embodiments, the control system 32 is communicably coupled to the obstacle scanner 37 and is configured to receive the sensing signal from the obstacle scanner 37. The control system 32 is further configured to instruct the vehicle 33 to pause or stop transporting wafer container if the sensing signal indicates presence of an obstacle between the vehicle 33 and the wafer container.

As shown in FIG. 7, the wafer container 15 is in the unsafe-to-use group and includes a top cover 80. The top cover 80 includes an extension structure 84 connected to the sidewall 57 of the shell 51 and extending laterally beyond a periphery of the container main body 21. The extension structure 84 causes the obstacle scanner 37 to detect presence of an obstacle (e.g., the sensing signal output by the obstacle scanner 37 indicates presence of an obstacle), and consequently causes the vehicle 33 to pause or stop transporting the wafer container 15.

On the other hand, when the vehicle 33 attempts to pick up the wafer container 11 mentioned above, which has no top cover, and when no other obstacle is present, the sensing signal output by the obstacle scanner 37 would indicate absence of an obstacle, and the vehicle 33 can start lowering the grip device 35 to grip the top flange 23 of the wafer container 11.

In accordance with an embodiment of the present disclosure, a method for managing a plurality of wafer containers (e.g., the wafer containers 11 described above) in a facility includes: using an overhead hoist transport system (e.g., the overhead hoist transport system 30 described above) to transport the wafer containers; categorizing each of the wafer containers into a safe-to-use group or an unsafe-to-use group; and covering a top flange of each wafer container in the unsafe-to-use group with a top cover (e.g., the top cover 50, 70 or 80 described above), wherein the top cover is sized or shaped to prevent the top flange of the wafer container from being gripped by a grip device of a vehicle of the overhead hoist transport system. In some embodiments, the step of categorizing the wafer containers and the step of covering the top flange of the wafer container can be carried out by automated equipment. In some embodiments, the method further includes one or more of the operations performed by the vehicle 33 described above.

In sum, the present disclosure provides a technique to prevent accidental usage of wafer containers that are unsafe to use (e.g., wafer containers that could contaminate or damage semiconductor wafers or wafer processing equipment). Any wafer container categorized as unsafe-to-use is covered with a top cover sized or shaped (e.g., having an increased width or height, including an extension structure, etc.) to prevent a top flange of the wafer container from being gripped by a grip device of a vehicle for moving wafer containers. By this arrangement, transport of any wafer container categorized as unsafe-to-use is automatically interrupted and thus the unsafe-to-use wafer container is prevented from getting involved in the fabrication of wafers.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A wafer container, comprising:

a container main body configured to accommodate one or more semiconductor wafers;

a top flange projecting from an upper surface of the container main body, wherein the top flange comprises a neck portion and a head portion, the neck portion is connected between the container main body and the head portion, the head portion is wider than the neck portion; and a top cover for interrupting transport of the wafer container, the top cover being provided atop the top flange, wherein the head portion of the top flange has a first height and a first width, the top cover has a second height and a second width, the second height is greater than the first height, and the second width is greater than the first width, wherein the top cover is positioned entirely above the container main body, wherein the top cover comprises an upper wall and a sidewall, the upper wall faces an upper surface of the head portion of the top flange, the sidewall is connected to the upper wall and is arranged around the head portion, wherein a periphery of the head portion is formed with at least one notch, and the sidewall comprises at least one first protrusion mating with the at least one notch, wherein the head portion has a cavity, the upper wall comprises a second protrusion inserted in the cavity, the cavity is substantially at a center of the head portion, and the second protrusion is substantially at a center of the upper wall.

2. The wafer container of claim 1, wherein the sidewall has a lower surface, and the lower surface is at a position below the head portion of the top flange.

3. The wafer container of claim 1, wherein the top cover comprises a shell and a cushioning member, the shell comprises the upper wall and the sidewall, and the cushioning member is disposed on an upper surface of the shell.

4. The wafer container of claim 1, wherein the top cover comprises an extension structure, the extension structure is connected to the sidewall of the top cover and extends laterally beyond a periphery of the container main body.

5. A wafer container, comprising:

a container main body configured to accommodate one or more semiconductor wafers;

a top flange projecting from an upper surface of the container main body, wherein the top flange comprises a neck portion and a head portion, the neck portion is connected between the container main body and the head portion, the head portion is wider than the neck portion; and a top cover for interrupting transport of the wafer container, the top cover being provided atop the top flange, wherein the head portion of the top flange has a first height and a first width, the top cover has a second height and a second width, the second height is greater than the first height, and the second width is greater than the first width, wherein the top cover is positioned entirely above the container main body, wherein the top cover comprises an upper wall and a sidewall, the upper wall faces an upper surface of the head portion of the top flange, the sidewall is connected to the upper wall and is arranged around the head portion, wherein a periphery of the head portion is formed with a notch, and the sidewall comprises a first protrusion mating with the notch, wherein the first protrusion extends in a height direction of the sidewall, and the notch extends from the upper surface of the head portion to a lower surface of the head portion.

6. The wafer container of claim 5, wherein the sidewall has a lower surface, and the lower surface is at a position below the head portion of the top flange.

7. The wafer container of claim 5, wherein the head portion has a cavity, the upper wall comprises a second protrusion inserted in the cavity.

* * * * *